(12) United States Patent
Yu et al.

(10) Patent No.: US 7,829,050 B2
(45) Date of Patent: Nov. 9, 2010

(54) METHODS OF FORMING SINGLE-CRYSTAL METAL-SILICIDE NANOWIRES AND RESULTING NANOWIRE STRUCTURES

(75) Inventors: Zhaoning Yu, Mountain View, CA (US); Zhiyong Li, Palo Alto, CA (US); Wei Wu, Mountain View, CA (US); Shih-Yuan Wang, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 565 days.

(21) Appl. No.: 11/707,601

(22) Filed: Feb. 13, 2007

(65) Prior Publication Data

US 2008/0193359 A1    Aug. 14, 2008

(51) Int. Cl.
  *C01B 21/068* (2006.01)
(52) U.S. Cl. .......................... 423/344; 423/345
(58) Field of Classification Search .................. None
  See application file for complete search history.

(56) References Cited

U.S. PATENT DOCUMENTS

| | | | |
|---|---|---|---|
| 6,656,573 B2 | 12/2003 | Chen et al. |
| 6,699,779 B2 | 3/2004 | Chen et al. |
| 6,773,616 B1 | 8/2004 | Chen et al. |
| 6,998,333 B2 | 2/2006 | Chen et al. |
| 7,087,946 B2 | 8/2006 | Chen et al. |

*Primary Examiner*—Edward M Johnson

(57) ABSTRACT

Various embodiments of the present invention are directed to methods of forming single-crystal metal-silicide nanowires and resulting nanowire structures. In one embodiment of the present invention, a method of fabricating nanowires is disclosed. In the method, a number of nanowire-precursor members are formed. Each of the nanowire-precursor members includes a substantially single-crystal silicon region and a polycrystalline-metallic region. The substantially single-crystal silicon region and the polycrystalline-metallic region of each of the nanowire-precursor members is reacted to form corresponding substantially single-crystal metal-silicide nanowires. In another embodiment of the present invention, a nanowire structure is disclosed. The nanowire structure includes a substrate having an electrically insulating layer. A number of substantially single-crystal metal-silicide nanowires are positioned on the electrically insulating layer.

20 Claims, 11 Drawing Sheets

METHODS OF FORMING SINGLE-CRYSTAL METAL-SILICIDE NANOWIRES AND RESULTING NANOWIRE STRUCTURES

STATEMENT OF GOVERNMENT INTEREST

This invention has been made with Government support under Contract No. HR#0011-05-3-0001, awarded by the Defense Advanced Research Projects Agency. The government has certain rights in the invention.

TECHNICAL FIELD

Embodiments of the present invention are related generally to nanoscale electronics. More particularly, embodiments of the present invention relate to methods of forming single-crystal metal-silicide nanowires and resulting nanowire structures.

BACKGROUND

Manufacturers and designers of integrated circuits continue to relentlessly decrease the size of integrated-circuit features, such as transistors and signal lines, and correspondingly increase the density at which features can be fabricated within integrated circuits. However, manufacturers and designers have begun to approach fundamental physical limits that prevent further decreasing feature sizes in integrated circuits fabricated by conventional photolithography techniques. Recent research efforts have turned to new, non-photolithography-based techniques for fabricating nanoscale electronics that represent a significant decrease in feature sizes from currently available, submicroscale electronics fabricated by currently available high-resolution photolithographic techniques.

In one approach to designing and fabricating nanoscale electronics, nanowires with molecular-scale widths can be fabricated on a surface of a suitable substrate. Nanowire junctions representing the closest point of contacts between adjacent nanowires may be fabricated to have properties of configurable resistors, switches, diodes, transistors, and other familiar electronic components of integrated circuits. In other approaches, nanowire-crossbar arrays including multiple layers of nanowires can be formed. The grid-like nanowire crossbars provide a two-dimensional array of nanowire junctions that can be configured to form a variety of different types of electronic devices or electronic components. In addition to being used to form nanowire junctions, nanowires have also found utility in sensors, as electrical interconnects, and in a number of other electrical and optical applications.

Nanowires can be fabricated using nanoimprint lithography. In nanoimprint lithography, a layer of nanoimprint resist made from a thermoplastic material or a photocurable polymer is deposited on a substrate. A nanoimprinting mold imprints a nanowire pattern in the nanoimprint resist. When the nanoimprint resist is a curable resist, the nanoimprint resist is cured with the nanoimprinting mold embedded within the nanoimprint resist. After curing, the nanoimprinting mold is removed and an anisotropic etching process is used to remove residue nanoimprint resist from the base of individual trenches defined in the nanoimprint resist that serve as a template for individual nanowires. Then, a metallic material is deposited within the trenches, for example, by evaporation, sputtering, or plating. The nanoimprint resist is then removed, leaving polycrystalline-metallic nanowires formed on the substrate.

As the lateral dimensions of polycrystalline-metallic nanowires continue to decrease, material defects in the polycrystalline-metallic nanowires can significantly influence the electrical properties of the polycrystalline-metallic nanowires. Grain boundaries and other defects within polycrystalline-metallic nanowires can significantly increase the resistivity of the polycrystalline-metallic nanowires. High-resistivity polycrystalline-metallic nanowires can deleteriously decrease the speed at which nanoscale-electronic devices operate. Therefore, researchers and developers of nanoscale-electronic devices continue to seek techniques for fabricating high-quality, low-resistivity nanowires so that nanowires with reduced lateral dimensions can be utilized in nanoscale electronics without compromising important performance characteristics.

SUMMARY

Various embodiments of the present invention are directed to methods of forming single-crystal metal-silicide nanowires and resulting nanowire structures. In one embodiment of the present invention, a method of fabricating nanowires is disclosed. In the method, a number of nanowire-precursor members are formed. Each of the nanowire-precursor members includes a substantially single-crystal silicon region and a polycrystalline-metallic region. The substantially single-crystal silicon region and the polycrystalline-metallic region of each of the nanowire-precursor members is reacted to form corresponding substantially single-crystal metal-silicide nanowires.

In another embodiment of the present invention, a nanowire structure is disclosed. The nanowire structure includes a substrate having an electrically insulating layer. A number of substantially single-crystal metal-silicide nanowires are positioned on the electrically insulating layer.

BRIEF DESCRIPTION OF THE DRAWINGS

The drawings illustrate various embodiments of the present invention, wherein like reference numerals refer to like elements or features in different views or embodiments shown in the drawings.

FIG. 3I is a schematic isometric view of the nanowire-crossbar array shown in FIG. 3H.

DETAILED DESCRIPTION OF VARIOUS EMBODIMENTS

Figure 1A:
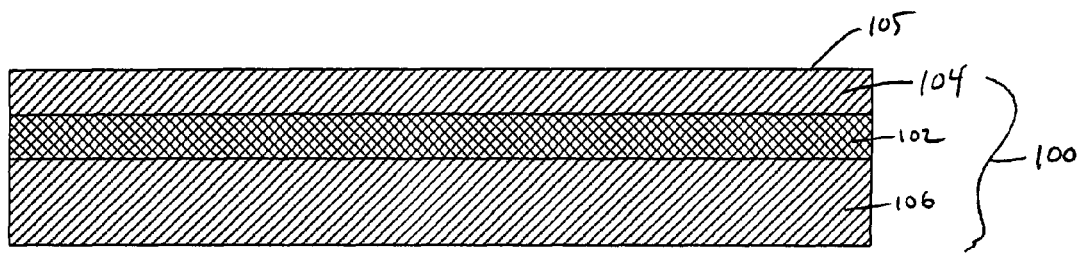
FIGS. 1A-1F are schematic side cross-sectional views that illustrate various stages in a method of forming single-crystal metal-silicide nanowires according to one embodiment of the present invention.
Figure 1B:
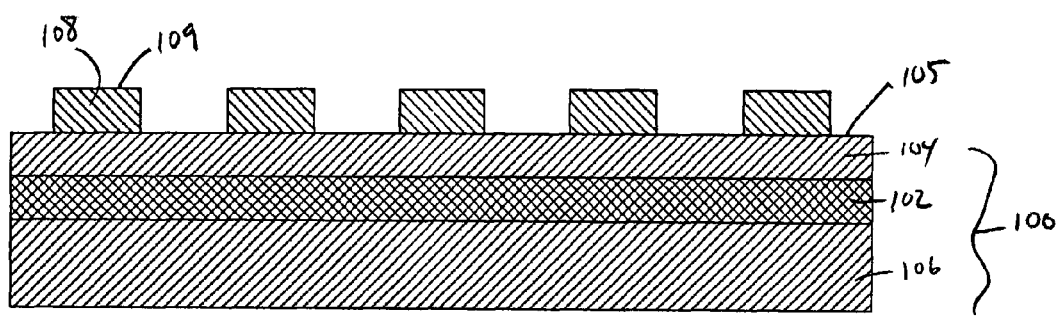

Various embodiments of the present invention are directed to methods of forming single-crystal metal-silicide nanowires and resulting nanowire structures. FIGS. 1A-1G illustrate various stages in a method of forming a nanowire structure according to one embodiment of the present invention in which each of the nanowires is a single-crystal metal-silicide nanowire. As shown in FIG. 1A, a silicon-on-insulator ("SOI") substrate 100 is provided. The SOI substrate 100 includes an electrically insulating layer 102 sandwiched between a single-crystal silicon layers 104 and 106. The electrically insulating layer 102 may be a layer of silicon dioxide, aluminum oxide, or another suitable electrically insulating material. Next, as shown in FIG. 1B, a resist is applied to an upper surface 105 of the single-crystal silicon layer 104 and patterned, as illustrated, to form elongated mask elements 108 each of which includes an upper surface 109. The elongated mask elements 108 may be patterned using nanoimprint lithography, electron-beam lithography, or another suitable patterning technique. For example, a nanoimprint resist may be applied to the upper surface 105 of the single-crystal silicon layer 104, followed by imprinting the nanoimprint resist with a nanoimprinting mold and anisotropically etching the nanoimprint resist to remove any remaining nanoimprint resist in regions compressed by the nanoimprinting mold.

Figure 1C:
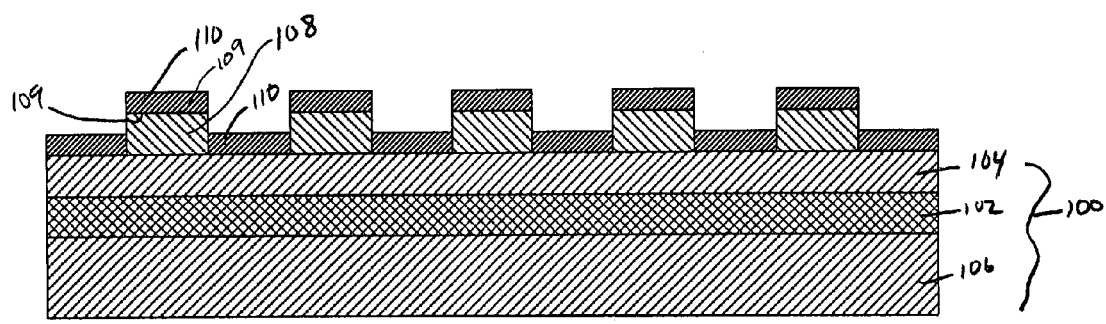
Figure 1D:
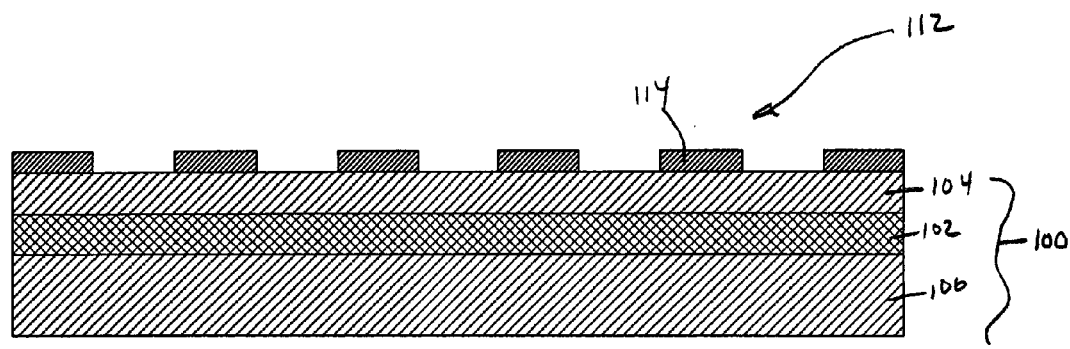

As shown in FIG. 1C, polycrystalline-metallic material 110 is deposited at least on the exposed upper surface 105 of the single-crystal silicon layer 104 between adjacent mask elements 108 by, for example, sputtering, evaporation, chemical vapor deposition ("CVD"), atomic layer deposition ("ALD"), electroplating, electroless plating, or another suitable deposition technique. As illustrated in FIG. 1C, the polycrystalline-metallic material 110 may also be deposited on the upper surface 109 of each of the mask elements 108. When a plating process is employed for depositing the polycrystalline-metallic material 110, the polycrystalline-metallic material 110 may preferentially nucleate on the exposed upper surface 105 of the single-crystal silicon layer 104 and the upper surface 109 may not be plated with any of the polycrystalline-metallic material 110. The polycrystalline-metallic material 110 may comprise any metallic material capable of reacting with silicon to form metal silicide. For example, the polycrystalline-metallic material 110 may comprise one or more transition metals (e.g., Sc, Ti, V, Cr, Mn, Fe, Co, Ni, Cu, Zn, Y, Zr, Nb, Mo, Pd, Ag, Ta, W, Pt, Au), Al, one or more rare earth metals (e.g., Er, Dy, Gd, Th, Ho, Tb, Sm), or another suitable metal or alloy capable of forming a metal silicide. Following deposition of the polycrystalline-metallic material 110, as shown in FIG. 1D, the elongated mask elements 108 are removed using, for example, a suitable solvent that selectively removes the elongated mask elements 108, leaving an etch mask 112 including a number of etch-mask elements 114 formed of the polycrystalline-metallic material 110.

Figure 1E:
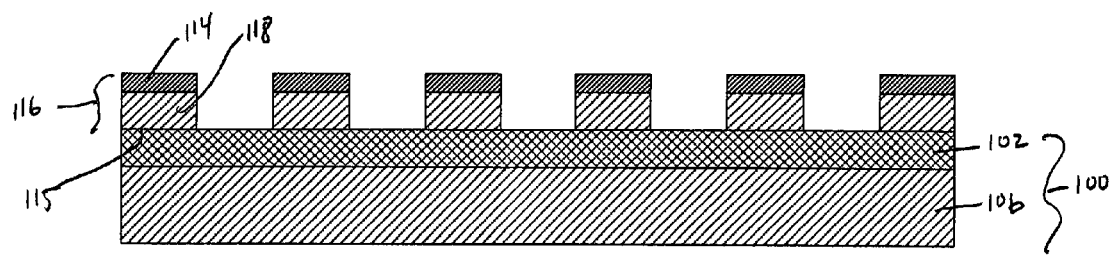

As shown in FIG. 1E, the etch mask 112, in conjunction with a suitable etching process (e.g., reactive ion etching ("RIE")), may be used to selectively etch portions of the single-crystal silicon layer 104 that are not covered by the etch-mask elements 114. An interfacial surface 115 of the electrically insulating layer 102 of the SOI substrate 100 may function as an etch stop to prevent further etching of the SOI substrate 100. A number of elongated nanowire-precursor members 116 are formed upon selectively removing portions of the single-crystal silicon layer 104. Each of the nanowire-precursor members 116 has a bi-layer structure including a single-crystal silicon region or layer 118 formed from a portion of the single-crystal silicon layer 104 and a polycrystalline-metallic region or layer formed of one of the etch-mask elements 114.

Figure 1F:
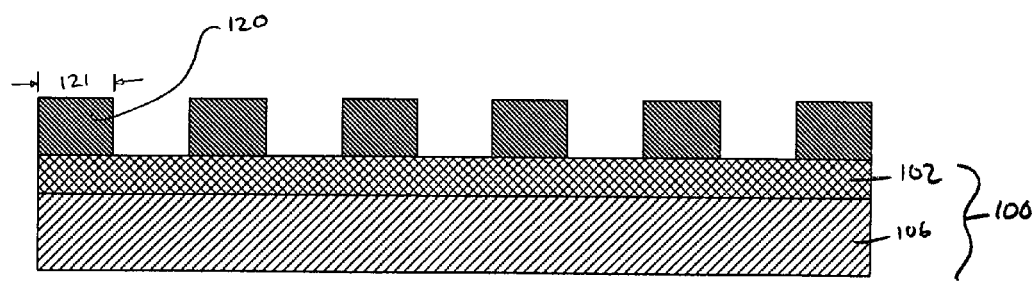
Figure 1G:
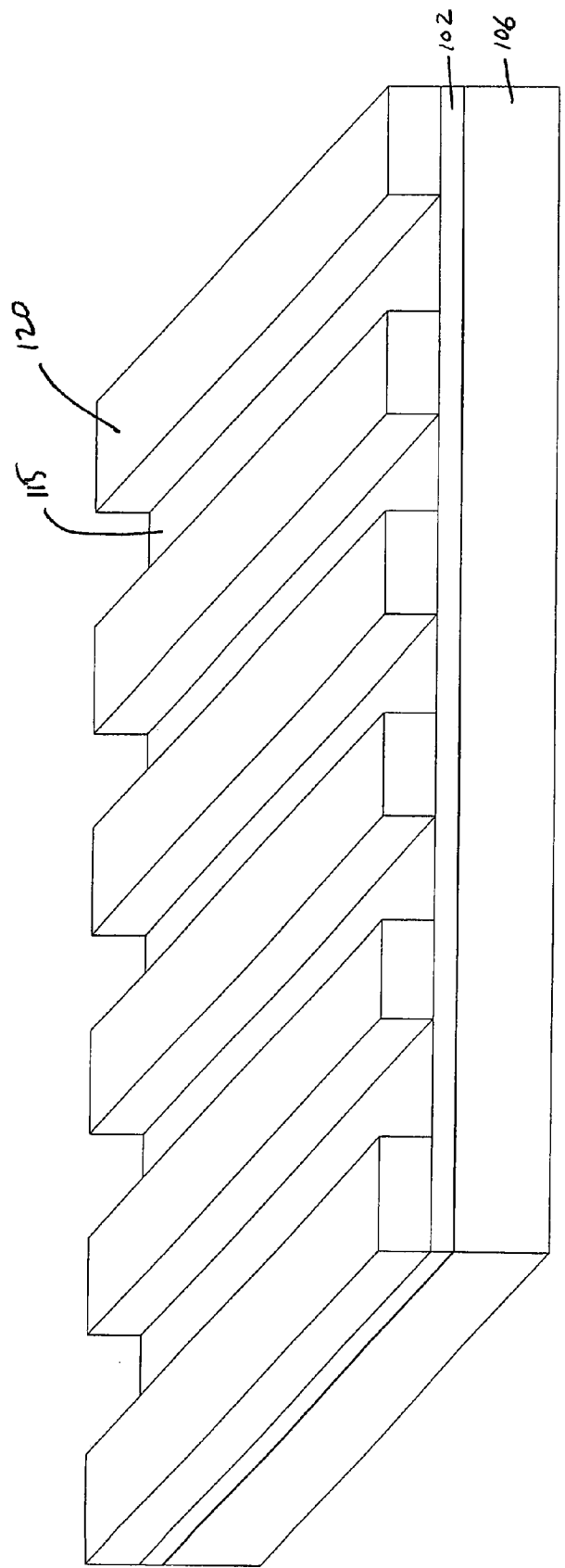
FIG. 1G is a schematic isometric view of the nanowire structure shown in FIG. 1F.

As shown in FIG. 1F, the in-process substrate structure shown in FIG. 1E is subjected to an annealing process at a suitably selected temperature. The annealing temperature causes a diffusive reaction to occur between the single-crystal silicon region 118 and the polycrystalline-metallic region (i.e., etch-mask elements 114) of each of the nanowire-precursor members 116 to form a number of single-crystal metal-silicide nanowires 120 having nanoscale lateral dimensions 121 of, for example, about 2 nm to about 500 nm. Despite the presence of grain boundaries in the polycrystalline metallic regions, the nanowires 120 so-formed exhibit a substantially single-crystal structure. However, small amounts of crystal defects may be present. Because each of the single-crystal metal-silicide nanowires 120 are formed on the electrically insulating layer 102, each of single-crystal metal-silicide nanowires 120 are electrically isolated from each other. FIG. 1G shows a schematic isometric view that best illustrates the elongated geometry of the single-crystal metal-silicide nanowires 120 formed after annealing.

The precise composition of the single-crystal metal-silicide nanowires 120 depends upon the composition and amount of the polycrystalline-metallic material (i.e., the etch-mask elements 114), and the annealing temperature. For example, when the etch-mask elements 114 comprise nickel, a nickel silicide having a chemical formula NiSi may be formed after annealing at a temperature between about 300° C. to about 700° C. for a suitable amount of time. It should be noted that a single-crystal metal-silicide nanowire 120 made from, for example, NiSi exhibits a resistivity that is substantially less than a similarly dimensioned polycrystalline nickel nanowire due to the general absence of any grain boundaries in the single-crystal metal-silicide nanowire 120 made from NiSi.

Figure 2A:
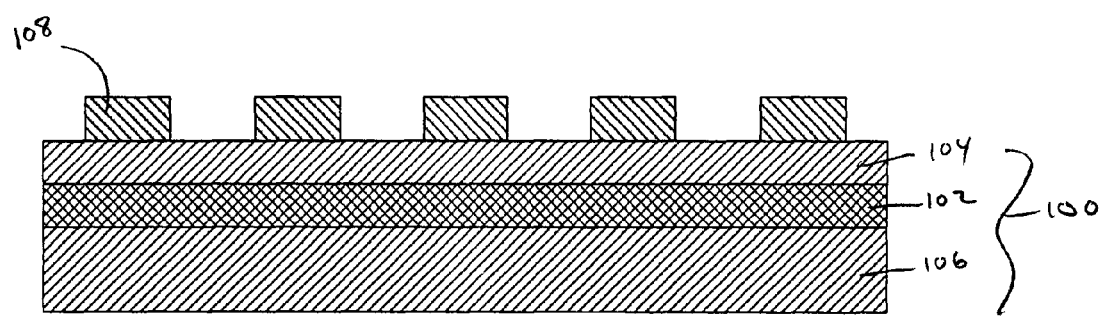
FIGS. 2A-2E are schematic side cross-sectional views that illustrate various stages in a method of forming single-crystal metal-silicide nanowires according to another embodiment of the present invention.
Figure 2B:
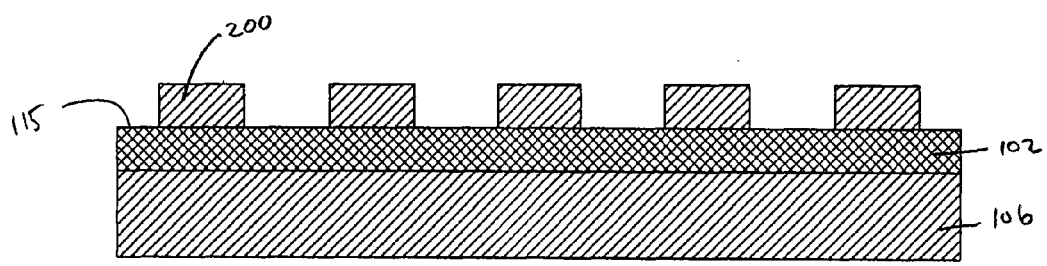

FIGS. 2A-2E are schematic side cross-sectional views that illustrate various stages in a method of forming single-crystal metal-silicide nanowires according to another embodiment of the present invention. FIG. 2A shows an in-process substrate structure that may be fabricated, as previously described with respect to FIGS. 1A and 1B. As previously described, a resist is applied to an upper surface 105 of the single-crystal silicon layer 104 and patterned, as illustrated, to form elongated mask elements 108. Next, as shown in FIG. 2B, the mask elements 108, in conjunction with a suitable etching process (e.g., RIE), are used to selectively etch portions of the single-crystal silicon layer 104 that are not covered by the mask elements 108. The interfacial surface 115 of the electrically insulating layer 102 of the SOI substrate 100 may function as an etch stop to prevent further etching of the SOI substrate 100. A number of elongated single-crystal silicon nanowires 200 are formed upon selectively removing portions of the single-crystal silicon layer 104.

Figure 2C:
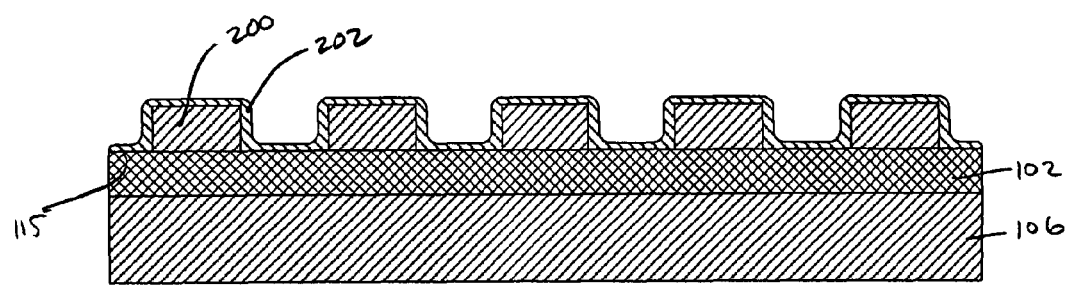

As shown in FIG. 2C, after forming the single-crystal silicon nanowires 200, a layer of polycrystalline-metallic material 202 is formed over the single-crystal silicon nanowires 200 and between adjacent single-crystal silicon nanowires 200. The layer of polycrystalline-metallic material 202 may cover regions of the interfacial surface 115 that are not covered by the single-crystal silicon nanowires 200. The layer of polycrystalline-metallic material 200 may be formed from the same materials and deposited in the same manner as polycrystalline-metallic material 110 shown in FIG. 1C. Although the layer of polycrystalline-metallic material 202 is illustrated as a conformal layer, in another embodiment of the present invention, a non-conformal layer may also be formed, depending upon the particular deposition process that is utilized. Furthermore, in yet another embodiment of the present invention, polycrystalline-metallic material may be deposited in a manner so that the polycrystalline-metallic material preferential nucleates on the single-crystal silicon nanowires 200 and does not generally deposit on the exposed interfacial surface 115 of the electrically insulating layer 102 between adjacent single-crystal silicon nanowires 200. The combination of the elongated single-crystal silicon nanowires 200 and regions of the layer of polycrystalline-metallic material 202 in contact with and proximate to the elongated single-crystal silicon nanowires 200 function as nanowire-precursor members similar to the nanowire-precursor members 116 shown in FIG. 1E.

Figure 2D:
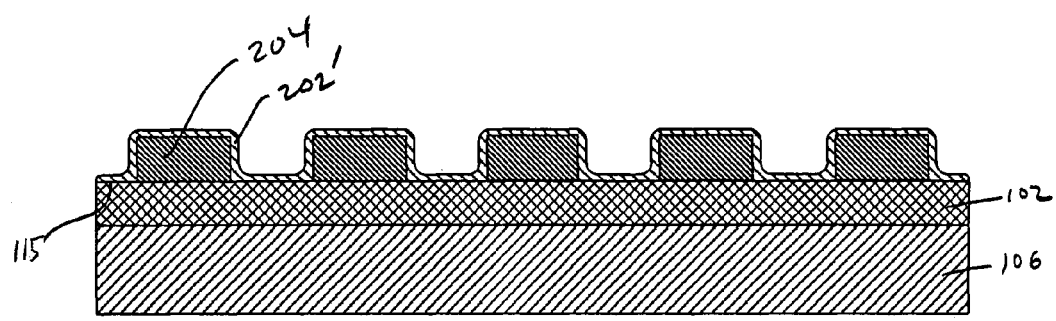
Figure 2E:
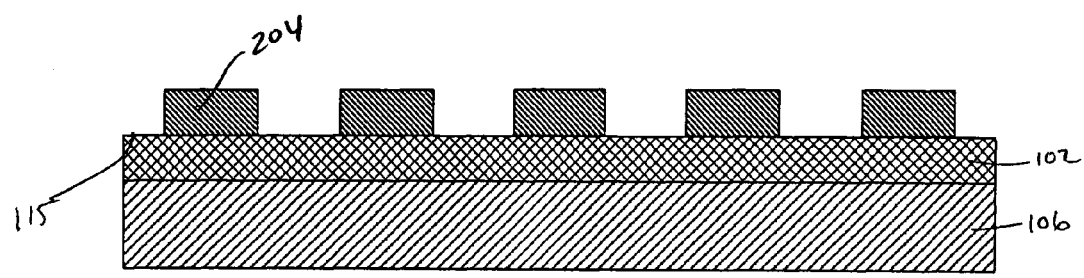

Next, as shown in FIG. 2D, after deposition of the layer of polycrystalline-metallic material 202, a number of single-crystal metal-silicide nanowires 204 are formed by subjecting the in-process structure shown in FIG. 2C to an annealing process as previously described with respect to FIG. 1F. As previously described, the single-crystal metal-silicide nanowires 204 are formed as a result of a diffusive reaction between the single-crystal silicon nanowires 200 and regions of the layer of polycrystalline-metallic material 202 in contact and surrounding each of the single-crystal silicon nanowires 200. After forming the single-crystal metal-silicide nanowires 204, un-reacted portions 202' of the polycrystalline-metallic material 202 are removed by utilizing a selective material removal process, such as ion milling or etching, that preferentially removes the un-reacted portions 202' over the electrically insulating layer 102 and the single-crystal metal-silicide nanowires 204. After removing the un-reacted portions 202', the single-crystal metal-silicide nanowires 204 remain on the electrically insulating layer 102 electrically isolated from each other.

Figure 3A:
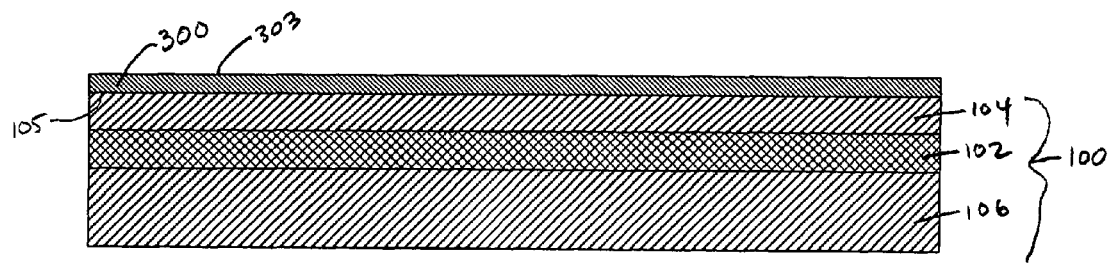
FIGS. 3A-3D are schematic side cross-sectional views that illustrate various stages in a method of forming single-crystal metal-silicide nanowires according to yet another embodiment of the present invention.
Figure 3B:
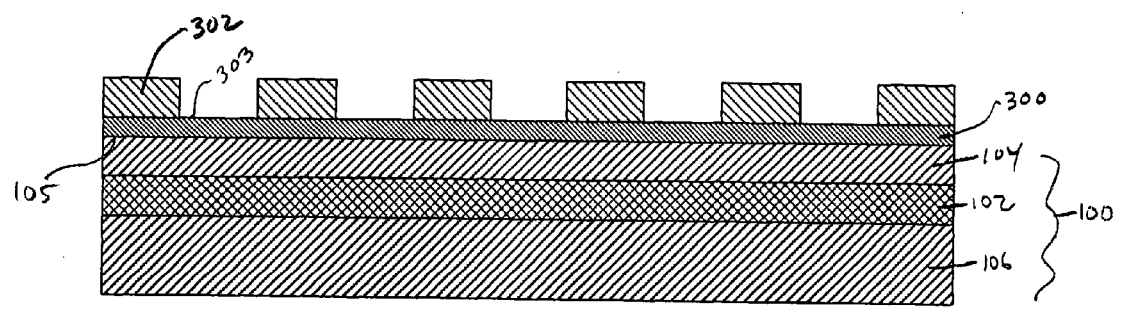

FIGS. 3A-3D are schematic side cross-sectional views that illustrate various stages in a method of forming single-crystal metal-silicide nanowires according to yet another embodiment of the present invention. As shown in FIG. 3A, a layer of polycrystalline-metallic material 300 having an upper surface 303 is deposited on the upper surface 105 of the single-crystal silicon layer 104. The layer of polycrystalline-metallic material 300 may be formed from the same materials and deposited in the same manner as polycrystalline-metallic material 110 shown in FIG. 1C. Next, a resist is applied to the upper surface 303 of the layer of polycrystalline-metallic material 300 and patterned, as shown in FIG. 3B, to form elongated mask elements 302. The elongated mask elements 302 may be patterned using nanoimprint lithography, electron-beam lithography, or another suitable patterning technique.

Figure 3C:
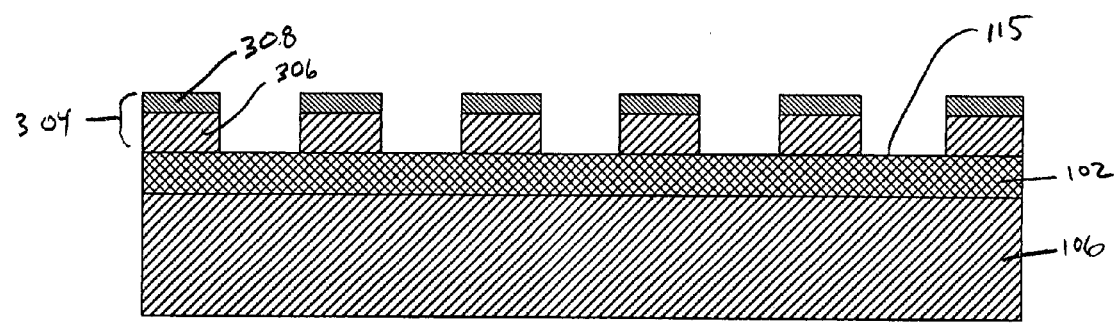
Figure 3D:
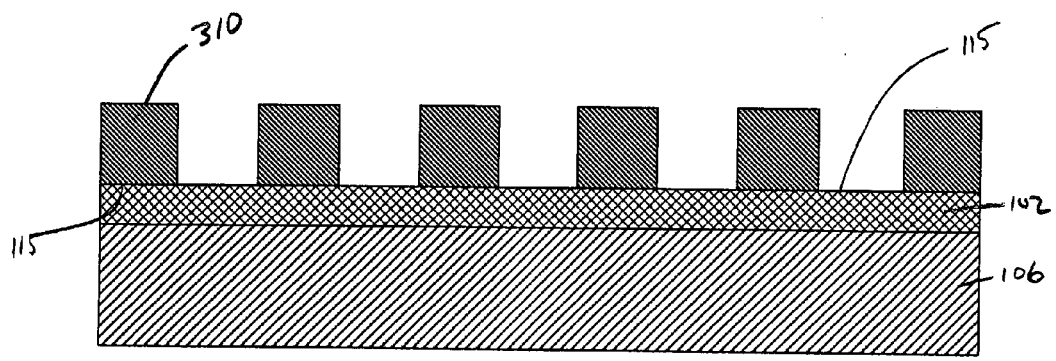

As shown in FIG. 3C, the mask elements 302, in conjunction with a suitable anisotropic material removal process (e.g., RIE or ion milling), are used to selectively remove portions of the layer of polycrystalline-metallic material 300 and the single-crystal silicon layer 104 that are not covered by the mask elements 302. As with the previously described embodiments, the interfacial surface 115 of the electrically insulating layer 102 of the SOI substrate 100 may function as an etch stop to prevent further etching of the SOI substrate 100. A number of elongated nanowire-precursor members 304 are formed upon selectively removing portions of the layer of polycrystalline-metallic material 300 and the single-crystal silicon layer 104. Each of the nanowire-precursor members 304 includes a bi-layer structure including a single-crystal silicon region or layer 306 formed from a portion of the single-crystal silicon layer 104 and a polycrystalline-metallic region or layer 308 formed of a portion of the layer of polycrystalline-metallic material 300. Next, as shown in FIG. 3D, after forming the nanowire-precursor members 304, a number of single-crystal metal-silicide nanowires 310 are formed by subjecting the in-process structure shown in FIG. 3C to an annealing process as previously described with respect to FIG. 1F. As previously described, the single-crystal metal-silicide nanowires 310 are formed as a result of a diffusive reaction between the single-crystal silicon region 306 and the polycrystalline-metallic region 308 of each of the nanowire-precursor members 304. Furthermore, the single-crystal metal-silicide nanowires 310 remain on the electrically insulating layer 102 electrically isolated from each other.

Any of the previously described embodiments of methods for forming single-crystal metal-silicide nanowires may be used to form nanowire-crossbar arrays or other components that utilize single-crystal metal-silicide nanowires. For example, FIGS. 3E-3I illustrate various stages in a method of forming a nanowire-crossbar array that utilizes single-crystal metal-silicide nanowires according to yet another embodiment of the present invention. Such nanowire-crossbar arrays are suitable for use as memory or logic devices. As merely an illustrative embodiment of the present invention, FIGS. 3E-3I illustrate various stages in a method of forming a second layer of single-crystal metal-silicide nanowires over the single-crystal metal-silicide nanowires 310 shown in FIG. 3D.

Figure 3E:
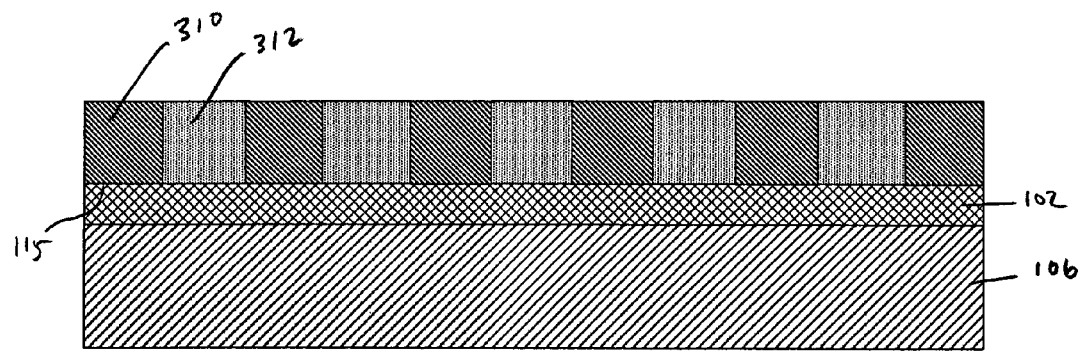
FIGS. 3E-3H are schematic side cross-sectional views that illustrate various stages in a method of forming a second layer of single-crystal metal-silicide nanowires over the first layer of single-crystal metal-silicide nanowires shown in FIG. 3D to form a nanowire-crossbar array according to yet another embodiment of the present invention.
Figure 3F:
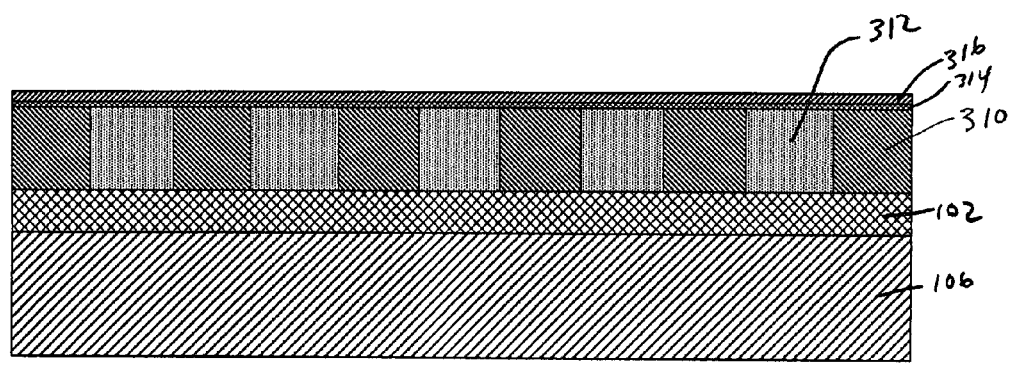

As shown in FIG. 3E, a dielectric material 312 (e.g., silicon oxide, silicon nitride, or an insulting polymer) may be deposited between each of the single-crystal metal-silicide nanowires 310 using CVD, ALD, or another suitable deposition process. Then, a layer of nanowire-junction material 314 may deposited on the dielectric material 312 and the single-crystal metal-silicide nanowires 310. As will be discussed in more detail below, portions of the nanowire-junction material 314 ultimately form nanowire junctions located at intersections between overlapping single-crystal metal-silicide nanowires. The nanowire-junction material 314 may be, in certain embodiments of the present invention, a variably resistive material that may reversibly transition between a relatively high-conductance state and a relatively low-conductance state upon application of two different state-transition voltages. For example, the variable resistive material may be a linear or nonlinear hysteretic resistor material. Such a variable resistive material allows nanowire junctions to be configured electronically to either electrically interconnect two nanowires that cross at a nanowire junction or to electrically isolate the two nanowires from one another. In additional embodiments of the present invention, other types of nanowire-junction materials 314 may be deposited to produce other types of nanowire-junction components. In certain embodiments of the present invention, multiple layers may be deposited in order to produce multi-layer nanowire junctions. A support material 316, such as a layer of titanium or another suitable material, may be deposited on the nanowire-junction material 314.

Figure 3G:
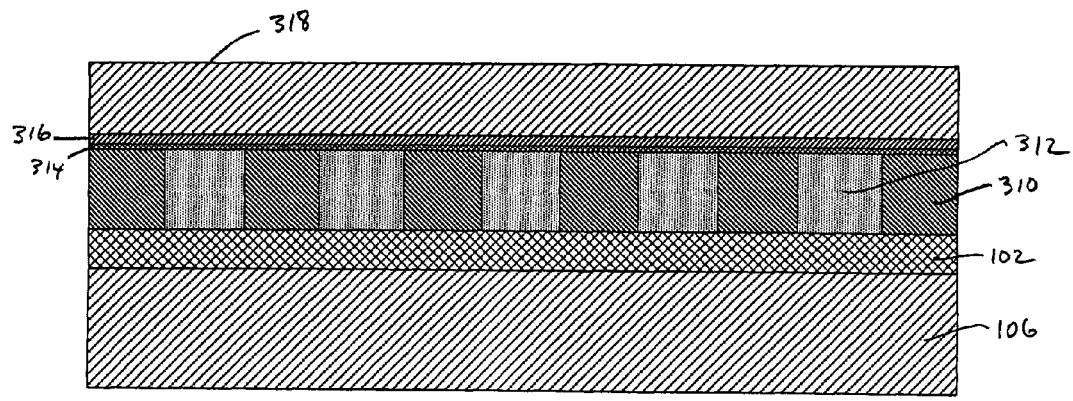
Figure 3H:
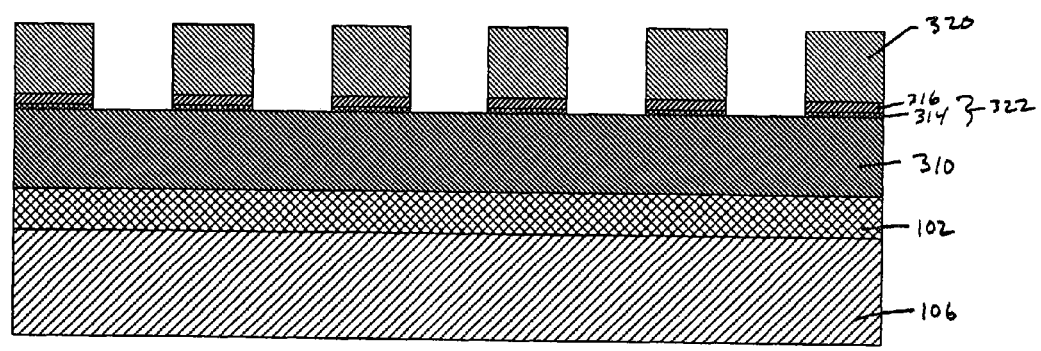
Figure 31:
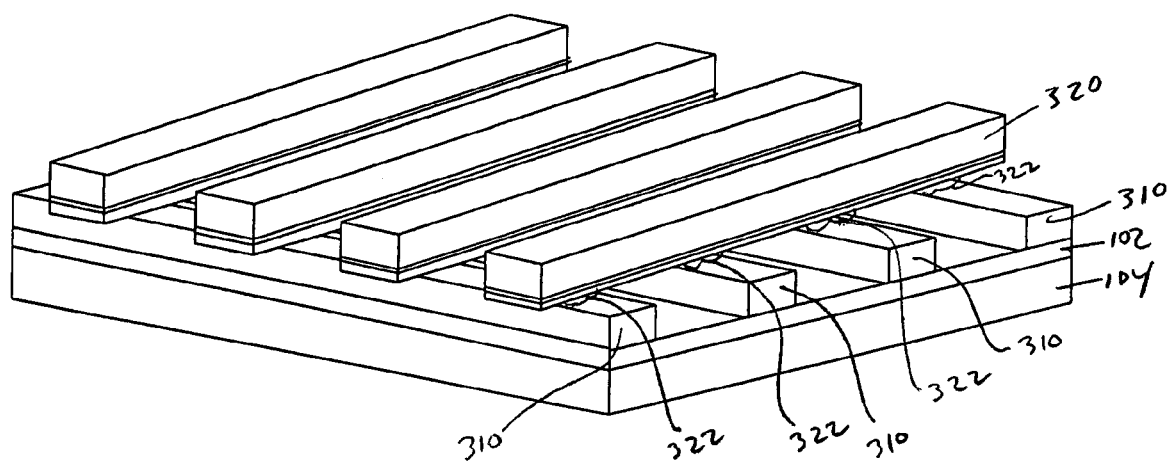

As shown in FIG. 3G, a thinned single-crystal silicon substrate 318 may be bonded to the support material 316 using, for example, a thermal bonding process or Van der Waal forces between the thinned single-crystal silicon substrate 318 and the support material 316. Then, as shown in FIG. 3H, a second layer of single-crystal metal-silicide nanowires 320 may be formed from the thinned single-crystal silicon substrate 318 using the same or similar process acts shown and described with respect to FIGS. 3A-3D. It is noted that the schematic cross-sectional view shown in FIG. 3H is rotated ninety degrees from the schematic cross-sectional view shown in FIG. 3G. In another embodiment of the present invention, a second layer of single-crystal metal-silicide nanowires may be formed in a separate process according to the method shown and described with respect to FIGS. 3A-3D. The second layer of single-crystal metal-silicide nanowires may be transferred to a flexible substrate and subsequently bonded to the support material 316.

With continued reference to FIG. 3H, after forming the single-crystal metal-silicide nanowires 320, portions of the support material 316 and the nanowire-junction material 314 may be removed by, for example, RIE so that the nanowire-junction material 314 and the support material 316 remain only along the underside of each of the single-crystal metal-silicide nanowires 320. A nanowire junction 322 is located at each region where a nanowire 320 in the second layer overlaps a nanowire 310 in the first layer. As best illustrated in the schematic isometric view shown in FIG. 3I (dielectric material 312 not shown for clarity), each of the single-crystal metal-silicide nanowires 320 overlies each of the single-crystal metal-silicide nanowires 310. Utilizing currently available configuration processes, each of the nanowire junctions 322 may be configured as a resistor, a variable-resistance resistor, a diode, a transistor, or other passive or active component. For example, the labeled single-crystal metal-silicide nanowire 320 shown in FIG. 3I may be electrically coupled to each of the underlying single-crystal metal-silicide nanowires 310 or electrically isolated from each of the underlying single-crystal metal-silicide nanowires 310 via individual nanowire junctions 322. A protective coating (not shown) may also be applied over and between adjacent single-crystal metal-silicide nanowires 320 to help protect the single-crystal metal-silicide nanowires 320 and the nanowire junction 322 from physical and chemical damage.

It should be emphasized that nanowire-crossbar arrays may also be fabricated utilizing the embodiments of methods discussed above with respect to FIGS. 1A-1G and FIGS. 2A-2E. For example, a second layer of single-crystal metal-silicide nanowires may be formed over the first layer of single-crystal metal-silicide nanowires 120 (FIG. 1F) or nanowires 204 (FIG. 2E) by similarly depositing a dielectric material between adjacent nanowires 120 or 204, depositing a nanowire-junction material over the nanowires 120 or 204, depositing a support material on the nanowire-junction material, bonding a thinned single-crystal silicon substrate to the support material, repeating the process acts shown and described with respect to FIGS. 1A-1G or FIGS. 2A-2E, and selectively removing portions of the nanowire-junction material and support material.

Although the present invention has been described in terms of particular embodiments, it is not intended that the present invention be limited to these embodiments. Modifications within the spirit of the present invention will be apparent to those skilled in the art. For example, in another embodiment of the present invention, the disclosed methods for fabricating single-crystal metal-silicide nanowires and the resulting nanowire structures may be utilized in many diverse applications besides nanowire-crossbar arrays, such as electrical interconnects in integrated circuits. Moreover, the single-crystal metal-silicide nanowires may be utilized in almost any other electrical or optical application in which a high-aspect ratio conductive structure is used.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purposes of illustration and description. They are not intended to be exhaustive of or to limit the present invention to the precise forms disclosed. Many modifications and variations are possible in view of the above teachings. The embodiments are shown and described in order to best explain the principles of the present invention and its practical applications, to thereby enable others skilled in the art to best utilize the present invention and various embodiments with various modifications as are suited to the particular use contemplated. It is intended that the scope of the present invention be defined by the claims and their equivalents:

The invention claimed is:

1. A method of fabricating nanowires, comprising:
   forming a number of nanowire-precursor members, wherein each of the nanowire-precursor members comprises a substantially single-crystal silicon region and a polycrystalline-metallic region; and
   reacting the substantially single-crystal silicon region and the polycrystalline-metallic region of each of the nanowire-precursor members to form corresponding substantially single-crystal metal-silicide nanowires.

2. The method of claim 1 wherein forming a number of nanowire-precursor members comprises:
   forming an etch mask on a substantially single-crystal silicon layer of a substrate, wherein the etch mask comprises the polycrystalline-metallic regions that form portions of the nanowire-precursor members;
   utilizing the etch mask to selectively etch the substantially single-crystal silicon layer to form the nanowire-precursor members.

3. The method of claim 2 wherein forming an etch mask on a substantially single-crystal silicon layer of a substrate comprises:
   depositing a resist on a surface of the substantially single-crystal silicon layer;
   patterning the resist to form a number of trenches;
   depositing the polycrystalline-metallic regions within each of the trenches; and
   after depositing the polycrystalline-metallic regions, removing the resist.

4. The method of claim 3 wherein patterning the resist to form a number of trenches comprises one of:
   patterning the resist using electron-beam lithography; and
   patterning the resist using nanoimprint lithography.

5. The method of claim 1 wherein forming a number of nanowire-precursor members comprises:
   providing a substrate comprising a substantially single-crystal silicon layer;
   forming the substantially single-crystal silicon regions of the nanowire-precursor members from the substantially single-crystal silicon layer; and
   after forming the substantially single-crystal silicon regions from the substantially single-crystal silicon layer, depositing the polycrystalline-metallic regions at least on each of the substantially single-crystal silicon regions to form the nanowire-precursor members.

6. The method of claim 5 wherein forming the substantially single-crystal silicon regions of the nanowire-precursor members from the substantially single-crystal silicon layer comprises selectively etching the substantially single-crystal silicon portion.

7. The method of claim 5 wherein:
   the substrate comprises an electrically insulating layer underlying the substantially single-crystal silicon layer; and forming the substantially single-crystal silicon regions of the nanowire-precursor members from the substantially single-crystal silicon layer comprises selectively etching the substantially single-crystal silicon layer until regions of the electrically insulating layer are exposed.

8. The method of claim 5 further comprising:
after reacting the substantially single-crystal silicon region and the polycrystalline-metallic region of each of the nanowire-precursor members, removing any portions of the polycrystalline-metallic regions that did not react with the substantially single-crystal silicon regions of the nanowire-precursor members.

9. The method of claim 5 wherein depositing the polycrystalline-metallic regions at least on each of the substantially single-crystal silicon regions to form the nanowire-precursor members comprises one of:
depositing a conformal layer that extends over and between each of the substantially single-crystal silicon regions, wherein the conformal layer comprises the polycrystalline-metallic regions; and
depositing a non-conformal layer over each of the substantially single-crystal silicon regions, wherein the conformal layer comprises the polycrystalline-metallic regions.

10. The method of claim 1 wherein forming a number of nanowire-precursor members comprises:
depositing a polycrystalline-metallic layer on a substantially single-crystal silicon layer of a substrate;
selectively removing material from the polycrystalline-metallic layer and the substantially single-crystal silicon layer to form the nanowire-precursor members.

11. The method of claim 10:
further comprising forming a mask on a surface of the substantially single-crystal silicon layer;
wherein selectively removing material from the polycrystalline-metallic layer and the substantially single-crystal silicon layer to form the nanowire-precursor members comprises utilizing the mask to selectively remove the material.

12. The method of claim 1 wherein reacting the substantially single-crystal silicon region and the polycrystalline-metallic region of each of the nanowire-precursor members to form corresponding substantially single-crystal metal-silicide nanowires is effected by annealing the nanowire-precursor members at a temperature between about 300° C. and about 700° C.

13. The method of claim 1 wherein the metal-silicide of each of the substantially single-crystal nanowires has a chemical formula MSi, where M is a metal selected from the group consisting of a transition metal, Al, and a rare earth metal.

14. A nanowire structure, comprising:
a substrate comprising an electrically insulating layer;
a number of substantially single-crystal metal-silicide nanowires positioned on the electrically insulating layer.

15. The nanowire structure of claim 14 wherein the metal silicide of the substantially single-crystal metal-silicide nanowires has a chemical formula MSi, where M is a metal and Si is silicon.

16. The nanowire structure of claim 15 wherein M is selected from the group consisting of a transition metal, Al, and a rare earth metal.

17. The nanowire structure of claim 14 wherein each of the substantially single-crystal metal-silicide nanowires comprises substantially single-crystal NiSi.

18. The nanowire structure of claim 14 wherein the substrate comprises semiconductor layer bonded to the electrically insulating layer.

19. An electronic device comprising the nanowire structure of claim 14.

20. A nanowire-crossbar array comprising a layer of nanowires overlying the substantially single-crystal metal-silicide nanowires of the nanowire structure defined in claim 14.

* * * * *

UNITED STATES PATENT AND TRADEMARK OFFICE
CERTIFICATE OF CORRECTION

PATENT NO. : 7,829,050 B2  
APPLICATION NO. : 11/707601  
DATED : November 9, 2010  
INVENTOR(S) : Zhaoning Yu et al.

Page 1 of 1

It is certified that error appears in the above-identified patent and that said Letters Patent is hereby corrected as shown below:

In column 10, line 9, in Claim 13, delete "single-crystal nanowires" and insert -- single-crystal metal-silicide nanowires --, therefor.

Signed and Sealed this  
First Day of March, 2011

David J. Kappos  
*Director of the United States Patent and Trademark Office*